United States Patent [19]

Lemaire et al.

[11] Patent Number: 5,417,905

[45] Date of Patent: * May 23, 1995

[54] METHOD OF MAKING A CARD HAVING DECORATIONS ON BOTH FACES

[75] Inventors: Gerard Lemaire; Philippe Lemaire, both of Nancy, France

[73] Assignee: ESEC (Far East) Limited, Hong Kong, Hong Kong

[*] Notice: The portion of the term of this patent subsequent to Aug. 4, 2009 has been disclaimed.

[21] Appl. No.: 896,697

[22] Filed: Jun. 10, 1992

Related U.S. Application Data

[63] Continuation-in-part of Ser. No. 527,184, May 22, 1990, Pat. No. 5,134,773.

[30] Foreign Application Priority Data

May 26, 1989 [FR] France ................. 89 06908
Mar. 2, 1990 [FR] France ................. 90 02624

[51] Int. Cl.$^6$ .................. B29C 33/18; B29C 45/14
[52] U.S. Cl. ..................... 264/139; 264/154; 264/162; 264/261; 264/263; 264/266
[58] Field of Search ............... 264/132, 154, 247, 259, 264/272.11, 272.15, 272.17, 263, 261, 266, 271.1, 279.1, 511, 139, 162; 437/209, 211, 217

[56] References Cited

U.S. PATENT DOCUMENTS

| | | | |
|---|---|---|---|
| 3,654,062 | 4/1972 | Loew | 264/247 |
| 3,839,129 | 10/1974 | Neumann | 264/247 |
| 4,216,577 | 8/1980 | Badet et al. | 264/272.17 |
| 4,427,615 | 1/1984 | Eskesen | 264/278 |
| 4,961,893 | 10/1990 | Rose | 264/272.17 |
| 5,102,828 | 4/1992 | Marchisi | 264/272.17 |
| 5,132,071 | 7/1992 | Sorensen | 264/266 |
| 5,134,773 | 8/1992 | LeMaire et al. | 437/209 |
| 5,152,861 | 10/1992 | Hann | 264/316 |
| 5,164,144 | 11/1992 | Rose | 264/261 |

*Primary Examiner*—Jan H. Silbaugh
*Assistant Examiner*—A. Y. 31 Ortiz
*Attorney, Agent, or Firm*—Darby & Darby

[57] ABSTRACT

A method for manufacture of a plastic credit card includes steps of providing a mold with two shells. When the mold is closed the shells have opposed faces defining a cavity for producing the card. The general outline of the card is defined by the peripheral edges of the mold faces. An image support is placed in each shell; the molds are brought together. Then the plastic is injected to fill the mold and form the card. Plastic is delivered through a mold face and the inflowing plastic forces the respective image supports against opposite mold faces. After cooling, the mold card, now decorated on two faces, is removed from the mold.

19 Claims, 14 Drawing Sheets

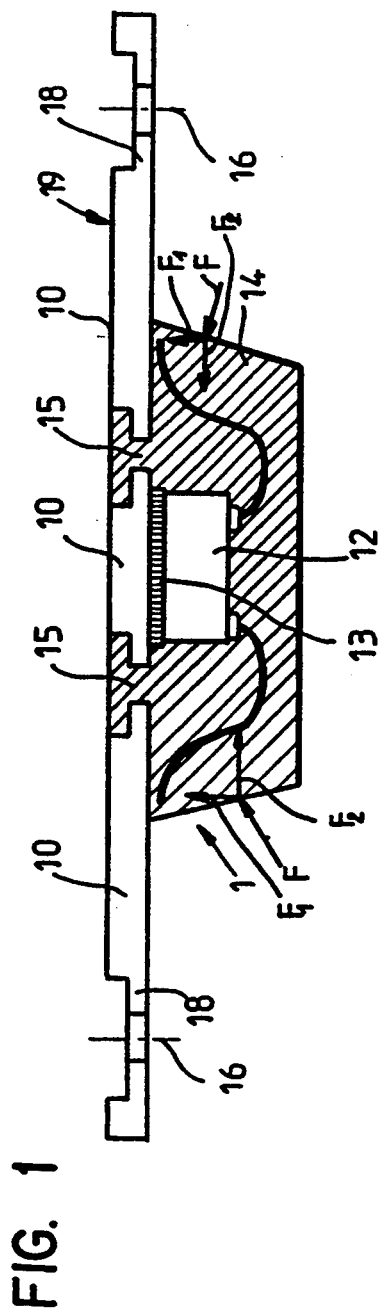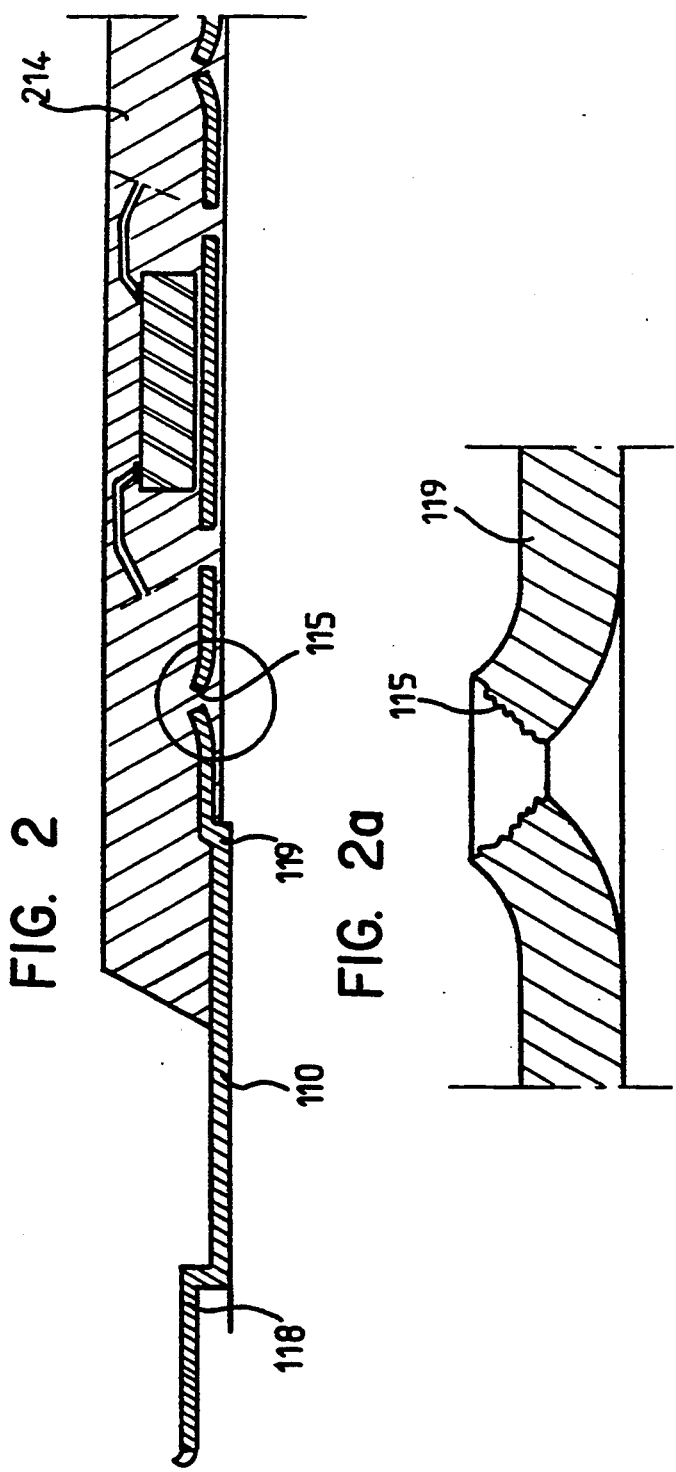
FIG. 1
FIG. 2
FIG. 2a

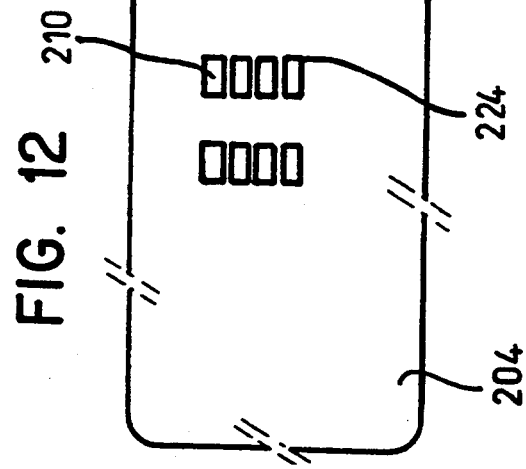
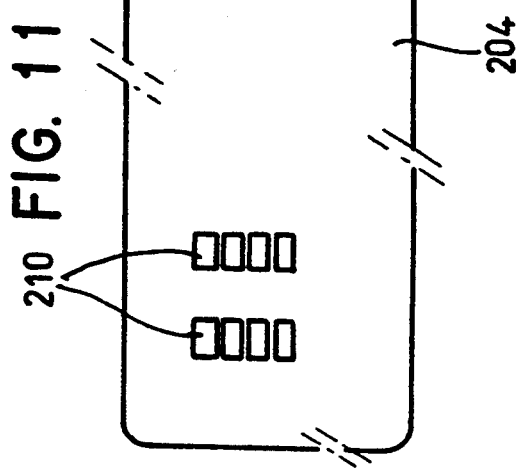
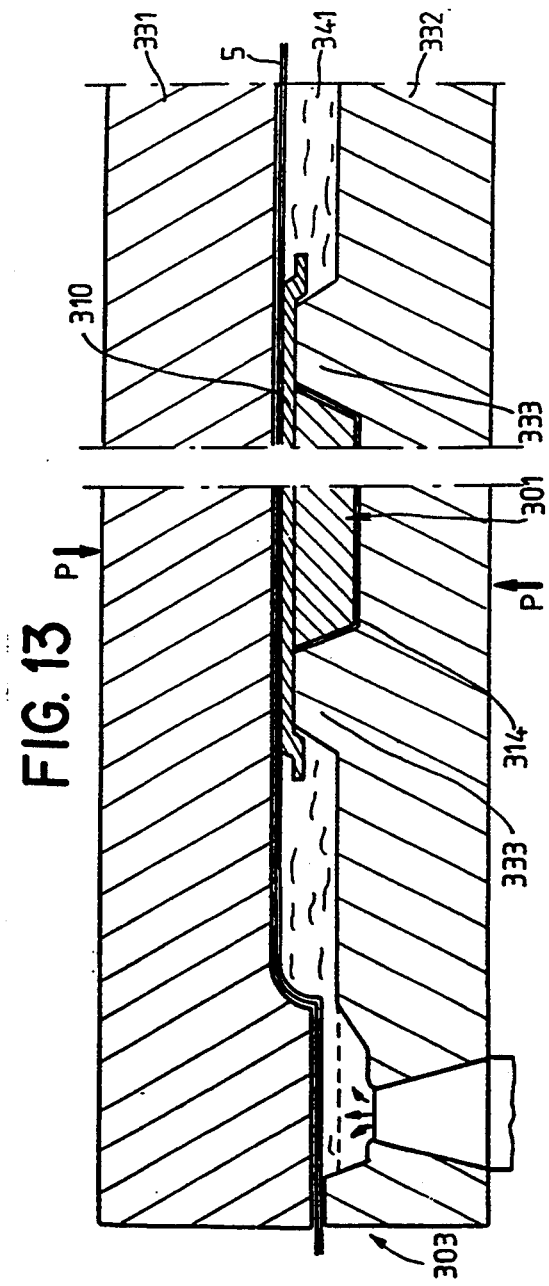

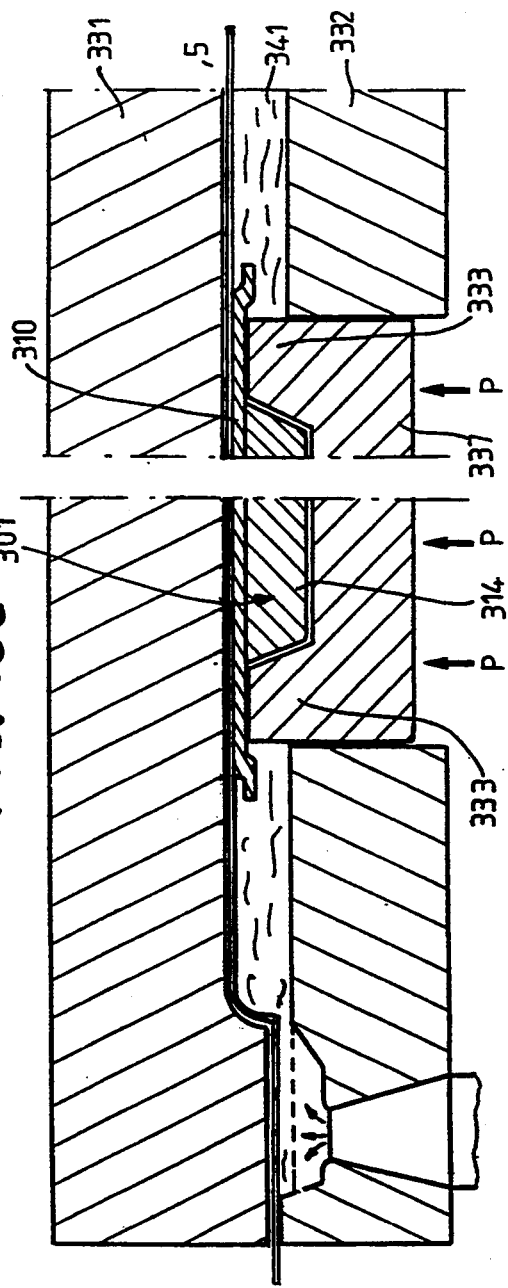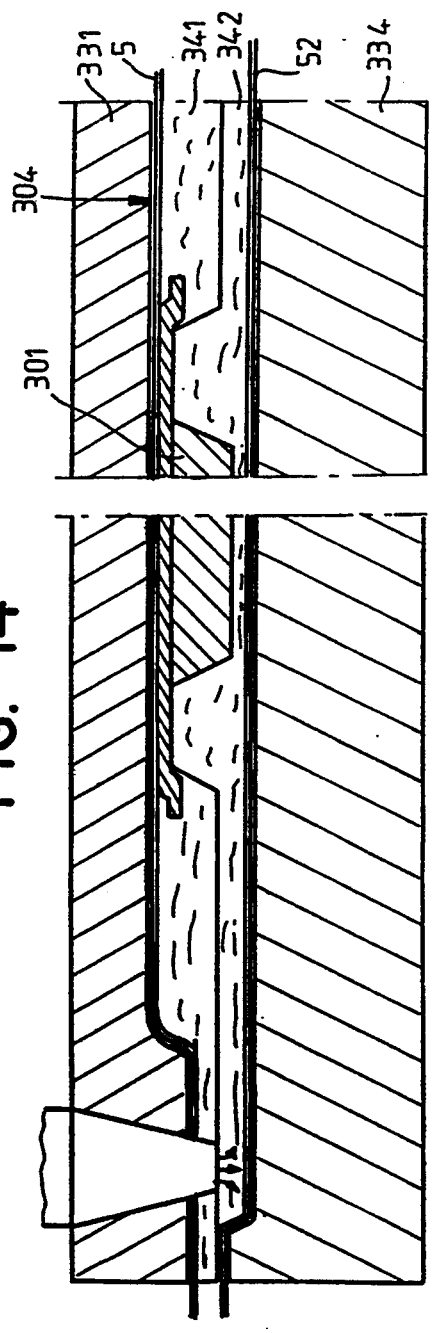

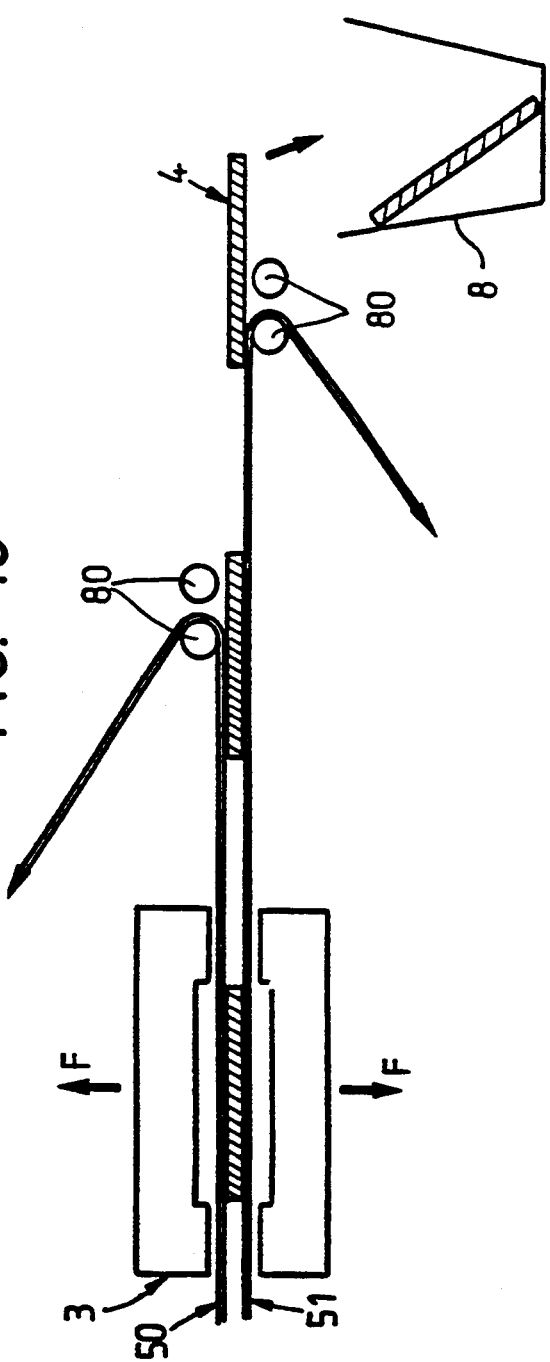
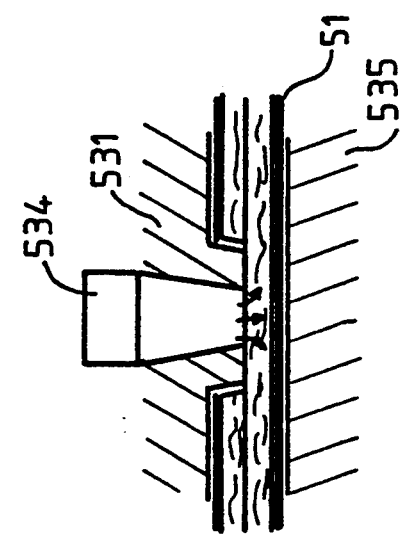
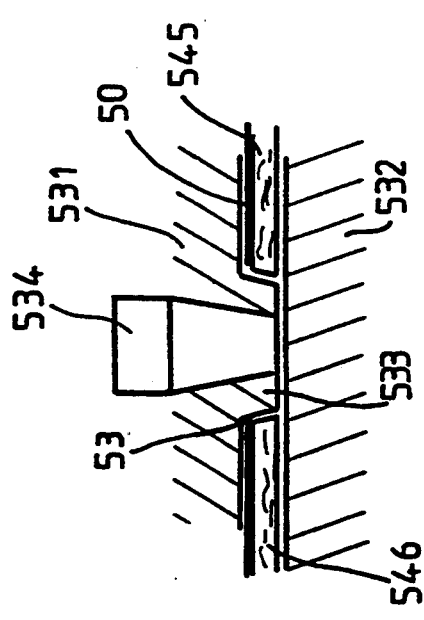

METHOD OF MAKING A CARD HAVING DECORATIONS ON BOTH FACES

This application is a continuation-in-part of Ser. No. 527,184, filed May 22, 1990, now U.S. Pat. No. 5,134,773.

BACKGROUND OF THE INVENTION

This invention relates to a method for manufacturing credit cards and the like, containing a microprocessor chip, as well as to credit cards and the like produced in accordance with the said manufacturing method.

These cards which have been devised recently are mainly credit cards containing an electronic module using a highly performing electronic component known as an electronic chip.

The main problem arising in the design of such "chip cards" relates to the positioning and fixation of the electronic module in the plastic card.

At present, most chip cards are manufactured by cutting out at first the plastic card from a board or by molding this card from plastic material.

This plastic card is shaped with a recess within which the electronic module will be positioned and glued in place.

The document EP 0 254 640 describes a method of this kind for producing chip cards. In this document, there is provided, according to a first embodiment, the formation of a cavity which opens into both faces of the plastic card, the electronic module being then positioned with its contact pieces flush with one face of the card, and the cavity being thereafter filled with glue for fixing said module. The module will then be protected to some extent by the glue, but there remains a risk that it may be subjected to external strains liable to impair its reliability.

In order to obtain a better protection of the electronic module, a second embodiment consists in forming a recess which opens into only one face of the card. The module will then not be accessible through the back of the card. However, this embodiment requires very complex operations, because every dimension must be strictly respected, since otherwise this would produce a card in which the contacts would not lie in the plane of the plastic card.

In order to overcome these drawbacks, it has been attempted to produce a chip card by molding the card body around the electronic module. For this purpose, the electronic module is positioned in a mold into which will be injected the plastic material for forming the plastic card.

A method of this kind is described, for instance, in the Japanese document 59.73567 or in the European document 0 227 854.

These methods are not satisfactory because they do not completely ensure that the positioning of the electronic module in the mold will be safely preserved.

The Japanese document provides for positioning the module by inserting into a recess of the mold a tenon carried by the module. Using this method, it is not possible to achieve a good quality of the card, because the plastic material being injected at a pressure of about 700 kg/cm$^2$ displaces the module.

European Patent 0 277 854 attempts to improve this method by using a vacuum system for holding down the module during the plastic injection. This suction is moreover provided for holding down the contacts of the module against the internal face of the mold.

This arrangement is not very effective, since it is difficult to obtain by means of a vacuum pump that the module will be maintained in place against the pressure exerted by the plastic material being injected.

This European Patent provides a second arrangement in which the electronic module is maintained by a plate supported by springs. In this arrangement, it is provided that during the molding process the plastic will first surround the module before pushing down the said plate against the springs in order to completely fill the cavity of the mold.

This is completely unrealistic, since the pressurized plastic will act upon the plate from the very start of the injection process, so that the module will no longer be kept in place. These arrangements do not make it possible to obtain cards in which the module is perfectly positioned and, moreover, the plastic seeps in between the contacts and the wall of the mold, thus soiling the contacts and making it necessary to provide a cleaning operation for cleaning these contacts. Obviously, this cleaning adds considerably to the production cost of the card.

The module described and used in this Patent is formed from a board of insulating material, one face of which receives a metal overlay for forming the contacts.

On the opposite face, the electronic chip will be fixed and wired, and then coated with resin. A module of this type is difficult to use because the resin does not adhere properly to the insulating material board. Also, the plastic used for forming the card body does not adhere properly to the board.

As a result, if a chip card made with such a module becomes folded, the insulating material board is separated from the plastic card and even from the resin, so that the card becomes completely unusable.

On another hand it is also stated, in this same European Patent 0 277 854, that for obtaining a proper anchoring of the module in the molded plastic, the resin coating must be given a dovetail shape. It has however been found that this disposition is very unfavorable. In fact, this dovetail shape defines a wedge-shaped volume into which the plastic material will flow during the injection process; due to the high injection pressure, the plastic material will then exert forces tending to separate the metal strip from the assembly formed of the electronic component and its coating. It is then impossible to rely, as in EP 0 277 854, on the shape given to the resin coating for fastening the module in the plastic card, and it is indeed preferable to avoid giving to the resin coating the shape described in this Patent, and much rather to give it an inverted shape, so that the forces exerted on the resin coating by the plastic material injected at a high pressure may tend to press this coating against the metal strip.

The present invention aims at overcoming these various drawbacks by providing a manufacturing method by which chip cards may be produced at a production cost which is considerably less than the present cost, and by which perfect cards may be obtained.

SUMMARY OF THE INVENTION

Towards this purpose, the invention provides a manufacturing method for the production of a chip card comprising an electronic module having contact pieces arranged within a plastic card, during which method the card is molded in a mold inside which the electronic module is positioned in such manner that its rear face and its periphery are embedded in the plastic material from which the card is formed, characterized in that the electronic module is formed by placing the electronic circuit in a precut and preformed metal strip so that this strip presents contact members the electronic microchip being soldered and wired into said strip, said electronic circuit being subsequently provided with a resin coating, said method being further characterized in that a pressure P is applied to the mold so as to clamp the electronic, the module firmly between the halfshells of said mold and to ensure that this module will be kept in positioning and blocking means and that its contact members will be firmly pressed against the inner wall of the mold.

In order to make the clamping possible, the electronic module and the positioning means provided in the mold have such dimensions that their total height will equal the height of the mold cavity.

Using an electronic module produced from a metal strip has the advantage that it makes it possible to use means capable of ensuring a proper adhesion between the resin and the metal strip as well as between the plastic material and the module.

For achieving this purpose:
perforations are made in the metal strip for ensuring a good fastening of the resin;
the metal strip is formed with a bent edge, relatively to the contact members;
the edge is curved for forming this bent edge.

In cases where the shapes given to the contact members would render this manufacturing operation difficult, the present invention provides the step of forming small resin knobs on the metal strip for ensuring a proper mechanical holding of the whole set of contact members, before gluing and wiring the electronic microchip and proceeding with the resin coating operation.

In order to avoid a separation of the metal strip from the resin coating which surrounds the electronic module, this resift coating will preferably be given a beveled shape, this shape being such that the forces exerted thereon by the plastic material being injected will tend to press the module against the metal strip carrying the contact members.

A further object of this invention is to provide an economical solution to the problem of decorating microchip cards.

In above-mentioned EP 0 277 854, the microchip cards are completely manufactured before being decorated.

It is currently admitted that, when using conventional printing methods, losses amounting up to 10% will usually be recorded for the printing of an image. These losses are due to a faulty positioning of the image on the card which is to be decorated, and also to a poor quality of the image itself.

When printing chip cards after they have been manufactured, up to 10% of them are destroyed as a result of printing one face, or up to 20% if both faces have to be decorated. This destruction causes the loss of the electronic module contained in the cards, bringing about a heavy loss of money, since this module is formed of the metal strip, the electronic component with its connection wires which are often made of gold, the glue and the epoxy coating, the cost of all of which is far from negligible. It can be said that, by way of example, the module of a card such as those used in telephone booths, containing a simple electronic component, has a production cost of about 1.50 FFranc, while the finished card is sold at about 5 FFr. The loss is even heavier with bank cards which sell at about 50 FFr. and contain a module which comprises a microprocessor, the value of which, alone, is about 40 FFr.

This is why it is provided, in accordance with this invention, that the card will be decorated while it is being molded, by means of an image-transfer film and/or a label placed in the mold. According to requirements, this decoration may be made on one or both faces of the card.

When carrying out, in accordance with this invention, the printing of an image or the fixing of a label at the time of molding the card, the losses formerly due to the printing techniques are eliminated, since use is made of image-transfer films and labels, the quality of which is duly controlled. However, molding the card with its decorative elements gives rise to problems which are mainly due to the dimensions of the molding cavity.

By way of example, it can be said that the magnetic card, when completed, has a thickness of 840 microns, while the labels being used have a thickness which will generally range from 65 to 80 microns, and a transfer film with its support will be from 70 to 80 microns thick.

The card molding operation does therefore require that the plastic material will properly fill a cavity having a depth of about 700 microns, but having an area of more than 40 cm$^2$.

A further problem relates to the keeping in place of the labels and films, since the plastic material being injected under very high pressure will tend to displace them.

This is why, in accordance with this invention, the method for molding the card which is to be decorated on both faces provides that one of the image supports has an aperture which will be placed around a boss surrounding the injection nozzle of one of the half-shells, while the other image support will be positioned against the surface of the boss in front of the outlet of the injection nozzle, both image supports being held by clamping in a zone located around the boss, the plastic material being injected between the two supports which are thus pressed against the walls of the half-shells while the plastic material is filling the mold cavity.

In conventional methods, the placing of the labels after the card molding operations requires a window to be cut out in advance in the label for the upper face of the card, while this window must present an outline matching very accurately the outline of the contacts which must appear on the surface of the card; thereafter, the label needs to be very precisely positioned, so that its cut-out window will register exactly with the outline of the contacts. This positioning operation is delicate and requires plenty of time.

On the contrary, the combined utilization of a transfer film put into place prior to the injection and of a metal strip for forming the contacts does away with the above-said delicate and costly operation, since it has been found that, while the image carried on the transfer film does-adhere very well to the injected plastic, it does not adhere to the metal, so that, when the film is removed after the injection, the image cuts itself out in registry with the outline of the contacts. Moreover, the use of such a transfer film provides a simplification of its positioning with respect to the imprint of the mold, by providing a printed surf ace which is larger than the card. In fact, the printed portion resting against the shell of the mold does not stick to this shell.

According to a first embodiment of the invention:
the electronic module presents a denelated skirt on its face opposed to the face which bears the contacts;
apertures are provided in the skirt;
the mold presents small knobs around which the apertures of the module will be engaged until the end faces of the skirt portions rest on the bottom of the mold.

According to a second embodiment:
the electronic module presents apertures positioned under each one of the contacts;
the electronic module is positioned by the said apertures engaging small knobs provided on one of the mold shells.

The card obtained with either of these embodiments is remarkable in that it is possible to see through its back face, either the tips of the skirt portions of the electronic module, or else blind holes in the bottom of which the underside of the contacts may be seen.

Such cards are particularly interesting because the positioning of the electronic module is impeccable and because their production cost is considerably less than in prior art methods.

However, the presence of cavities in the back face of the cards may have drawbacks for certain types of utilization of the cards.

In fact, if the card has to carry solely an electronic module, as in the case of a card used for paying telephone calls, then these cavities will cause no trouble whatever. On the contrary, the cards made in accordance with the invention are highly interesting because of their low production cost which is compatible with the fact that these cards are discarded after use.

However, these cavities may be quite troublesome and undesirable when a card must carry magnetic strips in addition to the electronic module, as will often be required for credit cards issued by the banks. In fact, these magnetic strips are usually positioned on the back face of the card in such manner that they underlay the contacts of the module present on the front face. Now, the presence of cavities under the magnetic strips may deform these, so that faults may occur in the data read-out or recording process.

A solution consisting in perforating the magnetic tape in registry with the cavities, taking care to place the perforations outside of the path followed by the read-out head, is not satisfactory, because the magnetic coating in this zone will no longer possess the required density.

This is why, according to a further embodiment of the invention, the card-molding operation is made in two successive injections so that the card will carry no trace of the positioning means used for positioning the module in the mold.

This third embodiment of the invention will then consist in molding over the electronic module in the first portion of the card, while the module is positioned on knobs of the mold. After this, the second part of the card will be molded over, and in this operation the cavities left by the knobs will be filled with plastic.

A fourth embodiment of the invention consists in molding a first card portion comprising positioning means for the electronic module, and then molding over the second portion after the module has been placed in said positioning means.

These third and fourth embodiments are advantageous since they make it possible, already at the time of the first injection, to position the injector nozzle at any desired point of the mold, since the imprint of this nozzle will be covered up during the second injection.

Advantageously, the magnetic strips which the card has to carry will be brought into place during one of the injections by means of a label carrying said strips and which will be placed in the bottom of the mold.

The cards being thus obtained have impeccable quality and a very low production cost.

BRIEF DESCRIPTION OF THE DRAWING

The invention will be more readily understood and further features and advantages thereof will appear from the following description, with reference to the drawings in which:

FIG. 1 is a cross-sectional view of a first embodiment of the central portion of the electronic module;

FIG. 2 is a partial view at a different scale;

FIG. 2a shows a detail of FIG. 2;

FIG. 11 is a view of the top face of the card obtained with the installation of FIG. 10;

FIG. 12 is a view of the back face of the card of FIG. 11;

FIG. 13 shows the first phase of a third embodiment of the invention;

FIG. 13a is a modified embodiment of the device of FIG. 13;

FIG. 14 shows the second phase of the said third embodiment of the invention;

FIG. 16a is a modified embodiment of the device of FIG. 16;

FIG. 18 shows diagrammatically a manufacturing line for the production of microchip cards according to the invention;

FIGS. 19a and 19b show a detail of the mold being used;

FIG. 23b shows the shape of the injection marking obtained on a tongue of a card produced by the mold of FIG. 23a;

FIGS. 24, 25a, and 26 are top plan views of credit cards made in a mold of FIG. 23a;

FIG. 25b is a cross-sectional portion of the mold taken along the line b—b of FIG. 25a;

FIG. 28b shows the shape of the injection marking obtained on a tongue of a card produced by the mold of FIG. 28a;

DESCRIPTION OF THE PREFERRED EMBODIMENTS

Figure 3:
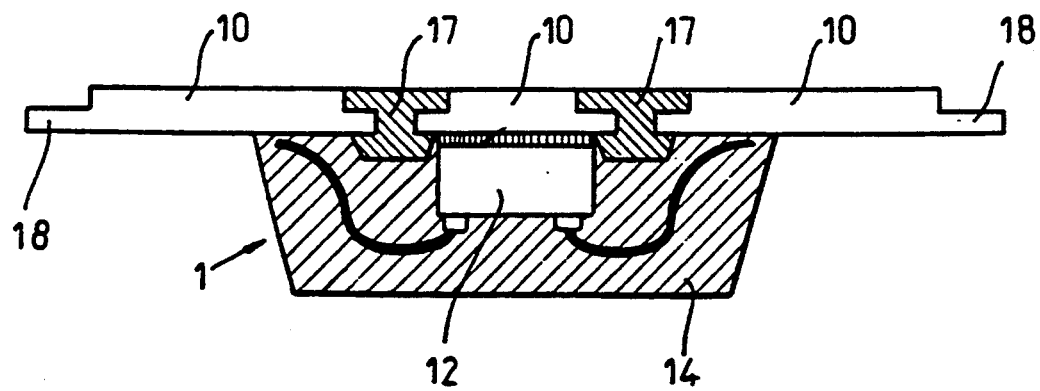
FIG. 3 is a cross-sectional view of a second embodiment of the central portion of the electronic module.

The first step in the method according to this invention consists in producing the electronic module to be inserted in the card.

This step uses techniques for assembling electronic components which are known for the production of plastic housings of the type used for encapsulating high-power components or microprocessors.

In this operation, use is made of a metal strip 19 which usually consists of copper, which is precut and preformed so that the required contact members 10 may be formed by cutting sections of the strip. Usually, this strip will be made of copper or of silver-plated or gold-coated copper-beryllium alloy. On this strip, the electronic microchip 12 will be soldered, for instance by means of conductive glue 13, and the wiring will be done by thermo-bonding and/or ultrasonic soldering.

The electronic circuit having thus been prepared on each cut section of said strip 19 is coated with a resin 14 after having been positioned in a suitable mold. This resin coating 14 protects the microchip 12 effectively and prevents any damage to the wiring. The resin 14 being used is preferably of an electronic-grade type, which does not contain any substances like chlorine or phosphorus which would risk to damage the chip 12. Therefore, an epoxy resin or a silicone will preferably be selected.

However, for components which are not expected to last for a long time, such as in telephone cards, it will be possible, after protecting the chip with a varnish, to use an appropriate thermoplastic resin, thus lowering production costs and increasing the production rate, because thermoplastics are much easier to use.

As can be seen from FIG. 1, the resin 114 is allowed to fill the gaps 15 between the contact pieces 10 in order to fasten them mechanically and to insulate them electrically, while at the same time providing for the mechanical cohesion of the module. The gaps 15 are designed with a larger surface on the face opposite the chip 12 in order to achieve a perfect adhesion of the resin 14 with the metal strip 19.

FIG. 2 shows a modified embodiment in which the metal strip 119 has only a small thickness. In this case, spaced perforations 115 are distributed over the strip for securing the fastening of the resin 114 with the metal strip 119. The electronic module 1 is then obtained by forming a cut 16 in the strip 19 so as to obtain a section carrying the contact members 10.

One of the difficulties encountered in this operation relates to the need of keeping the surface of the contacts 10 outside the module 1 perfectly smooth and clean, in order that they will function satisfactorily when the card will be used. These difficulties are particularly significant when there are wide gaps between the contact members or when the separations of these contact members are too remote from the clamping zone of the mold used for the coating operation, or else when the metal connections between the contact members are too thin and cannot be properly pressed by the resin against the mold bottom.

Whenever possible, a new design of the contacts will be provided for solving these difficulties, and if not, steps will be taken as shown in FIG. 3. In a first phase, resin buttons 17 are formed on the metal strip 19 in order to provide a mechanical connection between the contacts 10, and then the microchip 12 will be glued and wired, after cleaning the strip 19 wherever required. During the coating operation with the resin 14, this resin will fasten itself to the buttons 17 for forming the desired electronic module 1.

As can be seen from FIGS. 1–3, the metal strip 19, 119 is shaped so that cuts 16 have been made in this strip, the edge 18, 118 will be recessed, in respect of contact members 10, 110. In the case of FIG. 2, the strip 119 will have a bent edge 118 10 for this purpose. This shaping of the edges 18, 118 is useful, as will be explained hereinafter, for ensuring a good fastening of the module with the card.

The resin block 14 is designed with a beveled shape, so as to be wider near the contacts than on its end remote therefrom. Thus, as will be apparent from FIG. 1, the forces F exerted by the plastic material on this resin block 14 when filling the mold can be analyzed as vertical forces F1 directed towards the contacts 10 and horizontal forces F2 directed towards the inside of the resin block. The horizontal forces F2 being all opposed, two by two, annul each other, while the vertical forces F1 tend to press the resin block 14 against the contact members 10 and to displace the module I towards the upper side of FIG.1. The usefulness of this resultant force will be discussed hereinafter.

Figure 4:
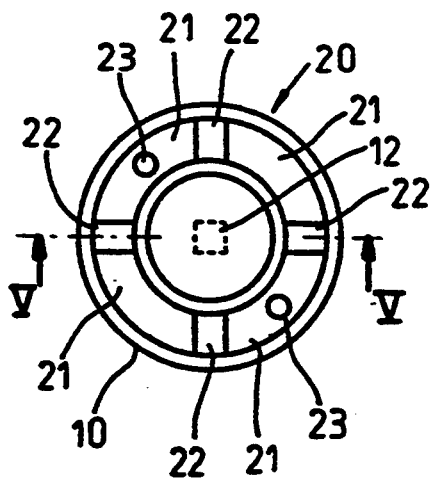
FIG. 4 shows an embodiment of the electronic module, seen from underneath.
Figure 5:
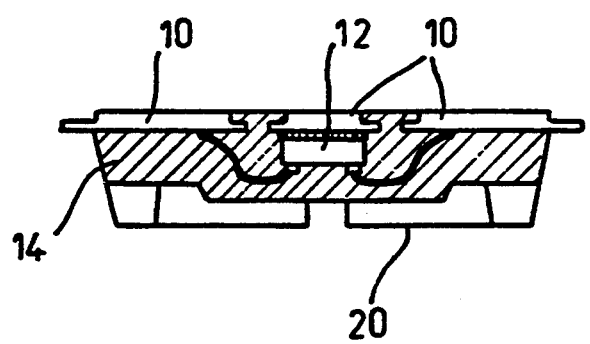
FIG. 5 is a cross-sectional view along line V—V of FIG. 4.

FIGS. 4 and 5 show in detail the shape given, in a first embodiment, to the resin block 14 and thus to the module 1. This shape is specially devised for allowing the method of this invention to be carried out effectively.

In this embodiment, the resin block 14 has a generally frustoconical shape and presents, on its face opposed to its face carrying the contacts 10, a crenated skirt 20. In the example shown, this skirt 20 is divided into four portions 21 by grooves 22. This skirt 20 presents openings 23 intended for positioning the module 1 inside the mold.

Figure 6:
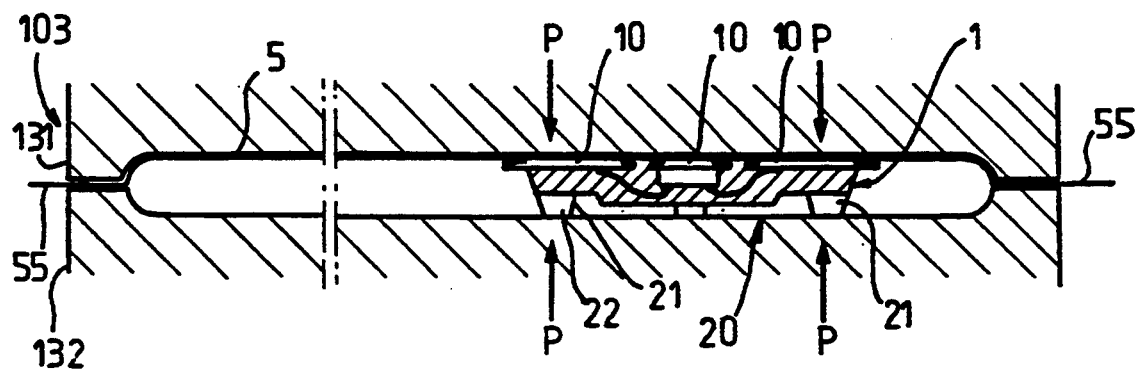
FIG. 6 is a cross-sectional view of a first installation for over-molding.

In order to carry out the over-molding operation over the module 1 for forming the chip card desired, the module is positioned, as shown in FIG. 6, inside a mold 103. The mold 103 in this first embodiment is formed, in a manner known per se, of two shells 131 and 132; one of the shells, in this case the lower shell 132, carries small lugs (not shown) over which the module 1 will be engaged. The module 1 engages the lugs with its apertures 23 until the end faces of portions 21 of the skirt 20 rest on the bottom of the shell 132, and then the upper shell 131 is positioned so as to close the mold.

This operation may advantageously be carried out using an appropriate tool which picks the modules placed on a transfer table, when use is made of a multiple mold. According to the invention, the module 1 is clamped between the shells of the mold 103 by applying a pressure P on this mold, as shown diagrammatically by the arrows P of FIG. 6, in the zone containing the module. For this purpose, the dimensions of the skirt 20 are such that, when the module 1 is in the mold 103, it contacts the upper shell 131 through its contact members 10 and it contacts the lower shell 132 through the ends of the skirt portions 21 which form preferential zones for the application of the pressure force. Thus, when pressure is applied, the module 1 is firmly clamped, which ensures an effective application of the contact pieces 10 against the internal face of the mold 103. This effect is further improved by the resultant of forces F1 directed towards the contact pieces, exerted by the plastic material on the resin block 14. As a result, rating the injection of the plastic material, this material cannot displace the module 1, and it cannot seep in between the module and the upper shell, which would be liable to soil the contact members.

During the over-molding operation, the grooves 22 dividing the skirt 20 provide passages for the plastic material being injected towards the lowermost zone of the skirt 20, so that it will fill said zone. The recessed edge 18, 181 being offset relatively to the plane of the contact members allows the plastic material to flow around the edges of the module 1 to as to ensure a perfect fastening of this module in the plastic card.

Figure 7:
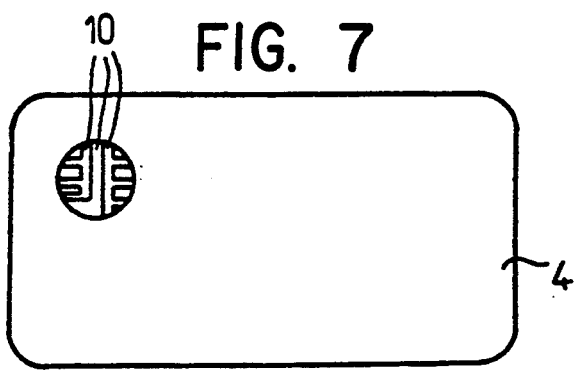
FIG. 7 is a view of the top face of a card obtained with the method according to the invention.
Figure 8:
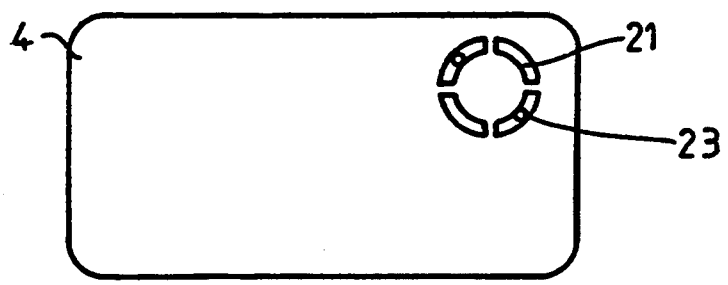
FIG. 8 is a view of the back face of this same card.
Figure 9:
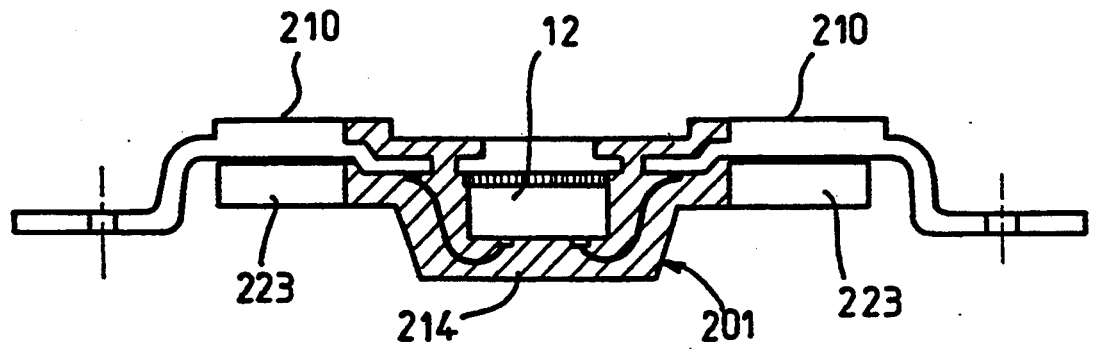
FIG. 9 is a cross-sectional view of third embodiment of the central portion of the electronic module.
Figure 10:
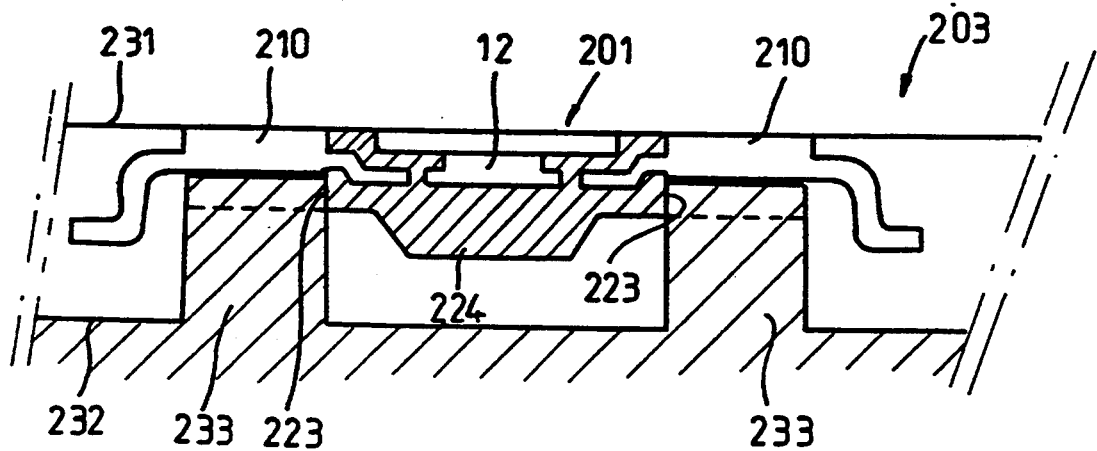
FIG. 10 is a cross-sectional view of a second installation for over-molding.

FIGS. 7 and 8 show the appearance of the front and back faces of the plastic card 4 obtained. It can be seen from FIG. 7 that the contacts 10 are visible on the front face of the card 4, so that they will be operational when the card is used on the back face of the card 4, it is possible to see the end faces of the skirt portions 21, and also the centering apertures 23.

The module 1 shown in the drawings has a circular cross-section. It would obviously be possible to give it another cross-section, without departing from this invention. Also, it will be possible to adapt, at will, the shape, the number and the distribution of the apertures 23.

The card 4 may, if desired, be printed for serving as a support for advertising material or for useful data such as instructions for using the card. The present invention provides carrying out this printing operation at low cost, using the process known as the image-transfer method.

As apparent from FIG. 6, a film 5 is placed in at least one of the shells of the mold 103. This film carries on its face directed towards the inside of the mold the image which is to be transferred onto the card. The film 5 is provided with portions 55 which extend outside of the mold and which Carr optical markings for positioning the film correctly. The transfer film may be designed with a colorless zone, in order to avoid printing the contacts.

It will also be possible to use a transfer film in which the image is adapted for adhering to the plastic material, but not to the metal parts. Thus, when the film is removed after the molding operation, the image will cut itself out so as to match the outline of the contacts. This technique is advantageous when the shape of the module is such that portions of plastic material are disposed between the contacts, since it will then be easy to decorate these portions, thus improving the aesthetics of the card.

FIGS. 9–12 show a modified embodiment in which the electronic module 201 presents contacts 210 having the shape of rectangles disposed in columns. As shown in FIG. 11, such a module may for instance comprise two columns of four contacts each.

In this embodiment, the resin block 210 which protects the microchip 12 is provided with openings 223 positioned under each contact. The resin block 214 fills, as in the previous case, the free spaces (not visible in FIG. 9) between the contacts 210 in order to ensure the mechanical stability of the module 201.

The module 201 being thus fabricated is placed in a mold 203 inside which it is positioned by these openings 223 engaging small lugs 233 provided in the mold shell 232. The height of the lugs 2 which ensure the positioning of the module 201 is such that, when this module 201 is thus placed in the mold, the total height will be equal to the height of the mold cavity; thus, when the mold is closed, the contacts 210 are pressed against the internal face of the shell 231, it will then be possible by exerting, as shown in FIG. 6, a pressure P on the shells 231, 232, to clamp the module 201 in the mold for obtaining a card 204, the front face of which displays these contacts 210 (FIG. 11). The reverse face of the card 204 disk plays blind holes 224 in the bottom of which the underside of the contacts 210 is visible.

Development tests of the method such as described hereinabove have produced cards which were quite satisfactory, although they presented cavities in their back face. There will now be described, referring to FIGS. 13–16, two further embodiments of this invention capable of producing a chip card with perfect dimensions, as in the previous embodiment, but having this further advantage that it does not present cavities in its back face. According to these two new embodiments, the card is produced by using two successive injections.

FIGS. 13, 13a and 14 illustrate a third embodiment of the invention. FIG. 13 represents the mold 303 formed of an upper shell 331 and a lower shell 332 used in the first phase of the manufacturing process. The electronic module 301 is positioned in the lower shell 332 by means of lugs 333, with its contacts 310 directed towards the upper shell 331. These lugs 333 may have any suitable shape and disposition for preventing a rotation of the module 301, as they cooperate with the resin block 314.

It will for instance be possible to insert these lugs 333 into openings formed in the resin block 314. According to another embodiment, a resin block 314 is formed with a non-circular shape, for instance a polygonal shape, and the lugs 333 are then in the form of buttons disposed in registry with each face of the resin block, or else they may be replaced by a crown having an internal cross-section adapted the shape of the resin block.

The free space inside the first mold always has a height less than the thickness of the card 304 which is to be produced. In order to carry out the printing of the microchip card simultaneously with the molding operation, an image-transfer film is positioned against the inside wall of the upper shell. The height of the lugs 333 is such that, when the module 301 is engaged with said lugs, the total height of this assembly will be equal to the free space inside the mold. When the film 5 and the module 301 are in place, the mold 303 is closed and a pressure, represented by the arrows P, is applied to the shells so that the module will be clamped in the mold during the injection. This pressure P is adjustable and is different from the pressure used for closing the mold. This clamping prevents the plastic material, which is injected at a pressure of about 700 kg/cm$^2$, to seep in between the contacts 310 and the upper shell 331 of the mold, which could soil the contacts and require a cleaning operation. This clamping insures also that the module will not be displaced by the plastic material and that it will remain perfectly positioned.

According to a modified embodiment shown in FIG. 13a, use is made of an insert 337 provided in the lower shell 332. This insert 337 forms a portion of the inner wall of the mold carrying the lugs 333. The pressure P is applied solely on 21 this insert 337, which further improves the clamping of the electronic module 301. The portion of the mold located on right side of FIG. 13a is not represented since, in a manner known per se in the art of molding, the mold may have either a single imprint or several imprints for forming a cluster of cards.

During the molding phase, a first part 341 of the chip card is produced. After the plastic material has hardened, the lower shell 332 is removed before a second mold is formed, assaying a second lower shell 334. Advantageously, the cycle may last for about 12 seconds. This second lower shell 334 is of such shape that the imprint of the second mold which it forms with the upper shell 331 matches the shape of the chip card 304 to be produced. A second image-transfer film 52 is placed against the inner wall of this second lower shell if it is required to print the face of the card 304 which does not carry the contacts.

After this, a second part 342 of the chip card is over-molded on top of the first part 341. This second part 342 is such that it will fill the cavities left by the lugs 333.

At this stage, it is no longer required to apply a pressure on the shells, since the module is already positioned and held in place by the first card portion 341. The chip card 304 obtained after these two phases of molding is perfectly flat over both its faces, and it contains an electronic module 301 which is accurately positioned.

This embodiment offers the advantage of obtaining cards 304 of even thickness, regardless of possible random variations in the dimensions of the module. This is due to the fact that the cavity of the second mold formed of the shells 331 and 334 has fixed dimensions and that during the injection, the plastic material which will form the second part 342 of the card fills in the empty spaces of the cavity, as it adapts to the dimensions of the module 301.

Figure 15:
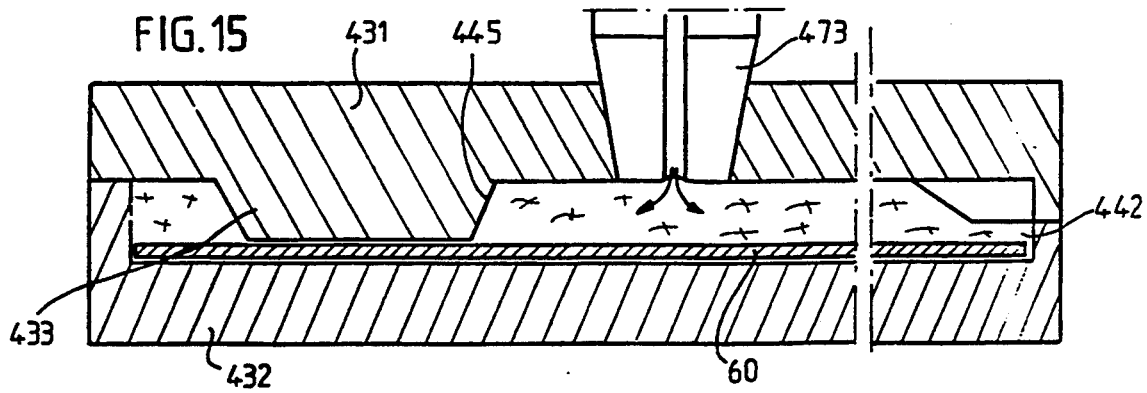
FIG. 15 shows the first phase of a fourth embodiment of the invention.
Figure 16:
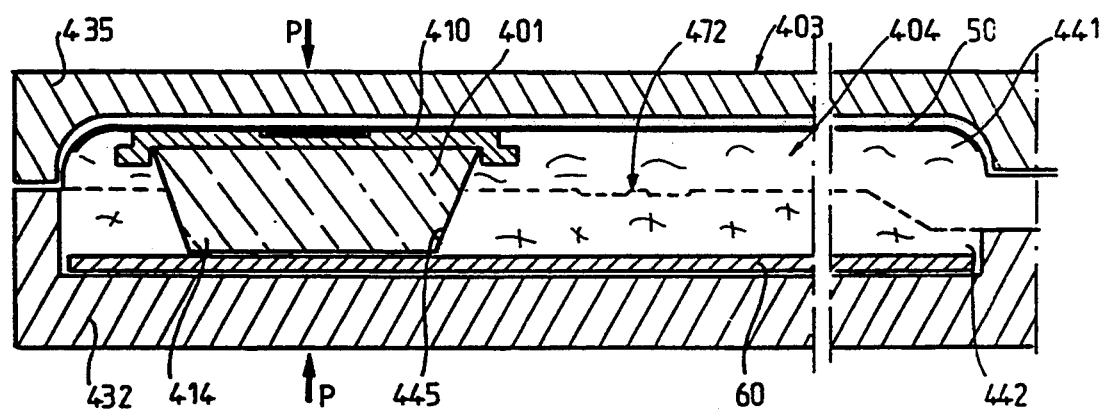
FIG. 16 shows the second phase of this fourth embodiment of the invention.
Figure 17:
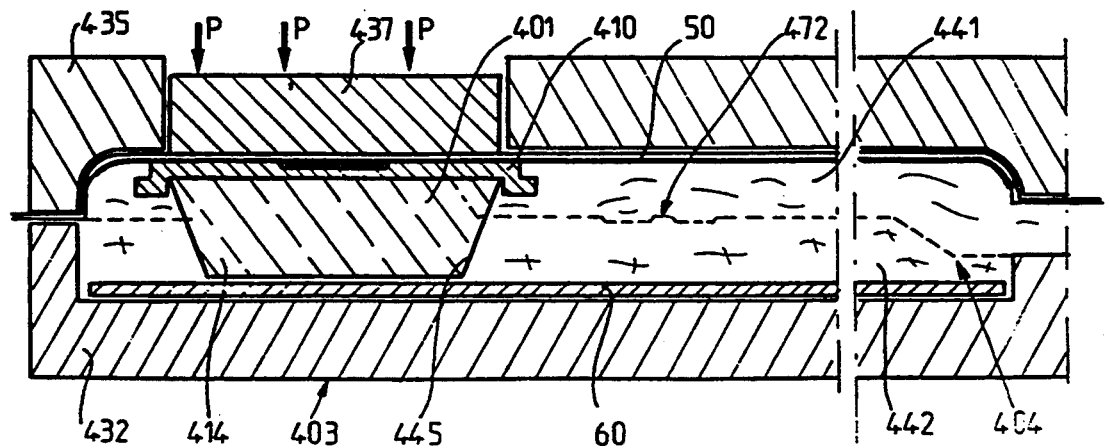
FIGS. 17a, 17b, 17c and 17d represent diagrammatically various designs of cards made by the method of this invention.
Figure 17A:
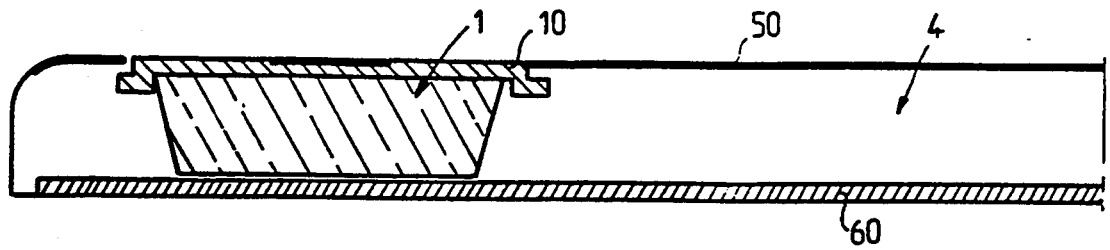
Figure 17B:
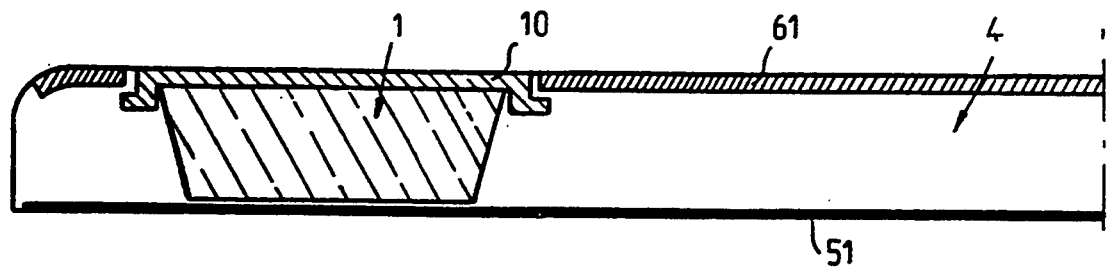
Figure 17C:
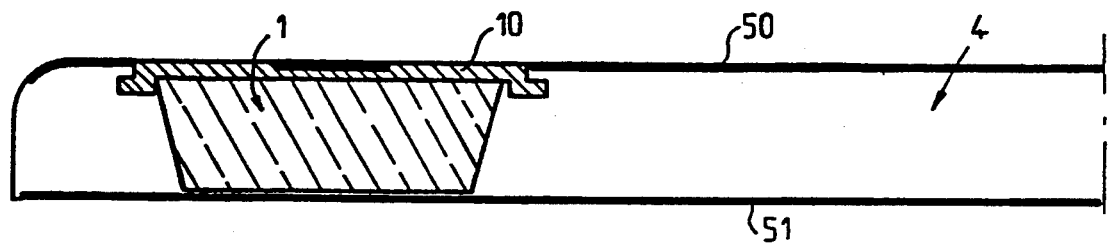
Figure 17D:
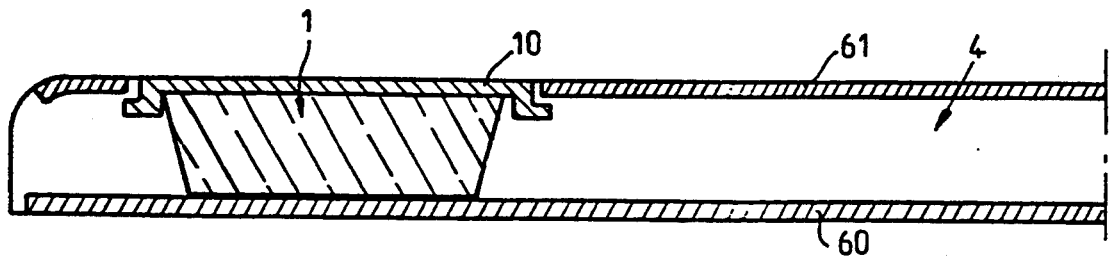

FIGS. 15, 16 and 16a represent a fourth embodiment of the invention. In this example, the portion 442 of the card 404 which does not contain the electronic module 401 is molded during a first phase. As can be seen from FIG. 15, the upper shell 431 of the mold carries an insert 433 designed for forming positioning means for the module, such as a cavity 445 in the portion 442 of the card 404. This insert 433 and, therefore, the cavity 445 have a cross-section matching the cross-section of the resin block 414 encapsulating the module 401 to be placed in the card. Preferably, this resin block 414 will have a non-circular section. It would also obviously be possible to give the resin block 414 a circular cross-section but in this case cavities should be provided in the insert 433 for forming lugs in the above-said cavity 445, which makes the design of the mold more complicated.

The elements intended for marking the card are positioned against the inner wall of the lower shell 432. These elements may consist in image-transfer films, such as previously described, but they may also consist in a label 60, as illustrated in FIG. 16a.

When producing a bank card which has to carry magnetic strips, these strips may be placed in advance on the label 60, using any known process such as lamination., printing or silk-screen printing. The label will be covered with a varnish adapted for being hot-glazed in the mold. Obviously, the box intended for the bearer's signature, as well as the hologram which is usually present on a bank card will either be placed on the card after the card had been manufactured, or else they may be provided on the label or on the transfer film used during the molding process.

After the mold has been prepared, as described above, the first molding phase will be carried out, in the manner illustrated diagrammatically in FIG. 15, for forming the first portion 442 of the card 404. After the plastic has set and hardened, the mold is opened and the upper shell 431 is removed. The electronic module 401 with its encapsulating resin block 414 will then be placed in the cavity 445 formed in the first card portion 442 which has just been molded. The contacts 410 are facing upwards, as shown in FIG. 16. The means for positioning the module 401, namely the cavity 445 in the first card portion 442, have a height such that the contacts 410 will be pressed against the wall of the mold 403 after this mold is closed with a second upper shell 435 inside which an image-transfer film 50 will have been positioned, if required.

As previously explained, a pressure P is exerted on one mold shells or otherwise, as shown in FIG. 16a, on an insert 437 for properly clamping the electronic module 401. The second phase of the molding process is then carried out for over-molding a second portion 441 of the card 404 over the first card portion 442.

It will be noticed that the imprint 472 left behind by the injection nozzle 473 will then become flush with the card surface, so that any desired position may be selected for this nozzle.

It is also obviously possible to provide, according to requirements, either labels 60, 61 or image-transfer films 50 51 on both faces of the card 4, as illustrated in FIGS. 17a–17d. It has also seen illustrated diagrammatically, in FIGS. 17a and 17c how it is possible, when the transfer film 50 is provided on the card face displaying the contacts 10 of the electronic module, to print the unused central portion of these contacts, thus hiding the connections between the contacts. In this case, the labels will compulsorily need to be cut out so as to clear spaces for the contacts. These four patterns can be obtained, using just as well any of the above-described embodiments of the invention, it being sufficient to place either an image-transfer film or a label in the mold.

FIG. 18 shows a diagram of an installation for the manufacturing of microchip cards, using the method of this invention. It represents a mold with its upper and lower shells which can be moved in the direction of the arrows F for opening the mold. The card will then be molded in the manner described in the foregoing, changing one of the shells when carrying out the third or the fourth embodiment. After this, using image-transfer films 50, 51, it will be possible, after retracting the shells, to pull the card or the cluster of cards having been molded out of the mold 3.

The films are then removed, one after the other, by passing them over rollers 80, and the cards 4 are collected in a storage or transfer bin 8. When the cards are decorated with labels 60, 61, the same installation can be used, the cards being either picked directly out of the mold or pulled out by means of a film carrying these labels.

FIGS. 19a and 19b represent a detail of the molds which facilitates the positioning of the image-transfer films when molding a card through two successive phases. FIG. 19a shows a mold formed of shells 531, 532 for molding the first portion of a card, namely here the top portion. In the mold shown here, two cards 545 and 546 are molded simultaneously. The upper shell 531 of the mold will then present a boss 533 located between the various card imprints, and an injection nozzle 534 opens through this boss 533. This boss will then be used for positioning the image-transfer film 50 by means of an aperture 53 provided in said film. The film may also be positioned by means of the injection nozzle, as shown in FIG. 14.

During the first phase of the molding process, the injection nozzle 534 is not in use, and the plastic material is injected through other nozzles (not shown) arranged in the shell 532, so that the transfer film 50 will be pressed by the plastic material against the wall of the shell 531.

On the contrary, the nozzle 534 will be used, as shown in FIG. 19b, during the second molding phase, after the shell 532 has been replaced by a new shell 535. In the same manner as previously, the plastic being injected presses the film 51 against the wall of the shell 535 as the plastic is filling the mold. This arrangement may be used in either of the shells, as preferred.

It will obviously be possible to use, instead of the transfer films 50, 51, labels connected together by a carrier film, or labels provided with a tongue which will be positioned in the zone of the boss 533. This explanation applies to any known type of image support.

Figure 20:
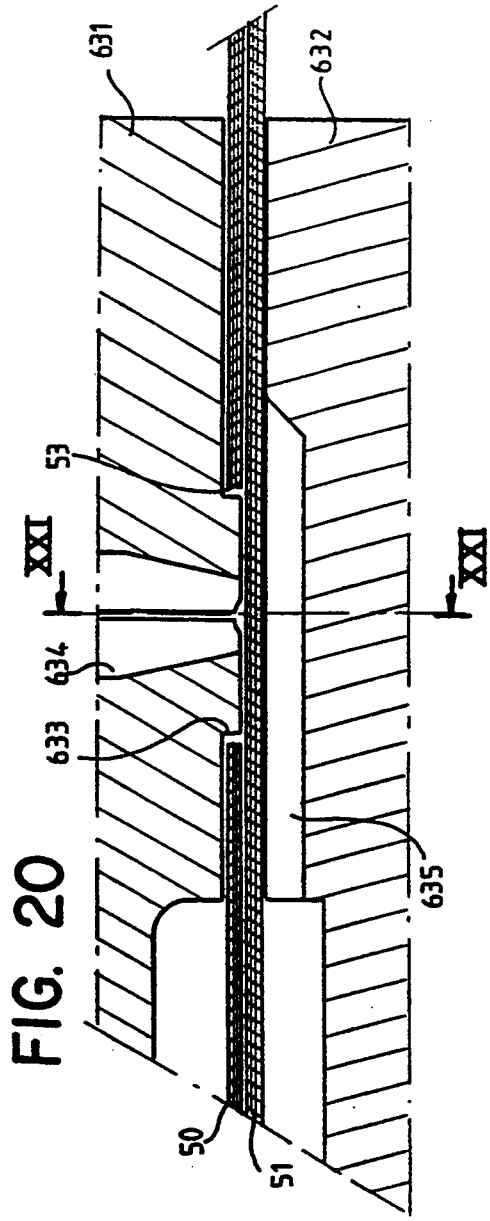
FIG. 20 is a partial cross-section of a mold.

FIGS. 20 and 21 illustrate the molding process for forming a card in a single injection phase, with a decorative element on each face of the card. FIG. 20 shows the mold formed of the shells 631 and 632, in which a course will be produced. One of the shells, here the upper shell 631 is provided with an injection nozzle 634 which opens through a boss 633 located outside the molding cavity. The nozzle 634 opens opposite a channel 635 provided in the shell 632 for directing the injected plastic towards the cavity.

The transfer film 50 which needs to be pressed against the wall of the shell 631 presents, in the manner described in reference to FIG. 19a, an opening 53 by means of which it is positioned around the boss 633, while the other film 51 is positioned against the boss surface, in front of the outlet of the injection nozzle 634. The transfer films 50, 51 are held in place, as shown in FIG. 20 and in FIGS. 21a and 21c, by clamping them in the junction plane of the shells 631, 632 in the zones surrounding the boss which comprises the nozzle 634 and the channel 635.

Figure 21B:
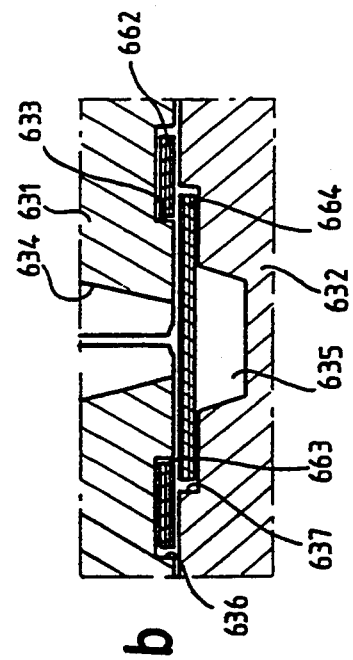
FIGS. 21a, 21b and 21c are cross-sectional views along line XXI—XXI of FIG. 20.
Figure 21C:
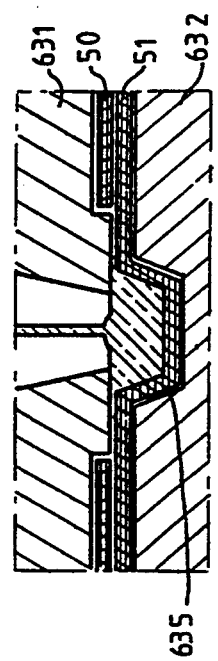

FIG. 21c illustrates the injection of the plastic material. It can be seen that it is the plastic material which presses the film 51 into the bottom of the channel 635.

Similarly, the plastic flowing towards the molding cavity pushes apart the films 50 and 51, thus pressing them correctly against the mold walls as it gradually fills the cavity.

This procedure makes it possible to obtain a card according to this invention having good qualities of use as well as aesthetic qualities.

Figure 21A:
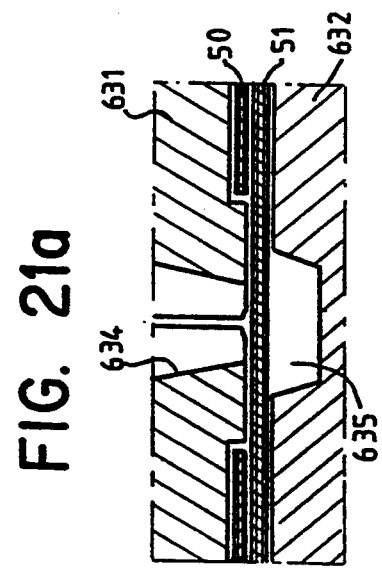

FIG. 21b shows an arrangement similar to that of FIG. 21a, in the case when the decorative elements are labels provided with tongues 662, 664 for holding them in place in the mold. In this case, the shells 631, 632 present recesses 636, 637 for receiving these tongues. The tongues 662, 664 are then held by being clamped against the face of the opposite shell, using a method similar to that used for the transfer films 50, 51. The plastic material is injected between the tongues, thus pressing the tongue 664 against the wall of the channel 635 and pressing the labels against the walls of the mold cavity.

Figure 22A:
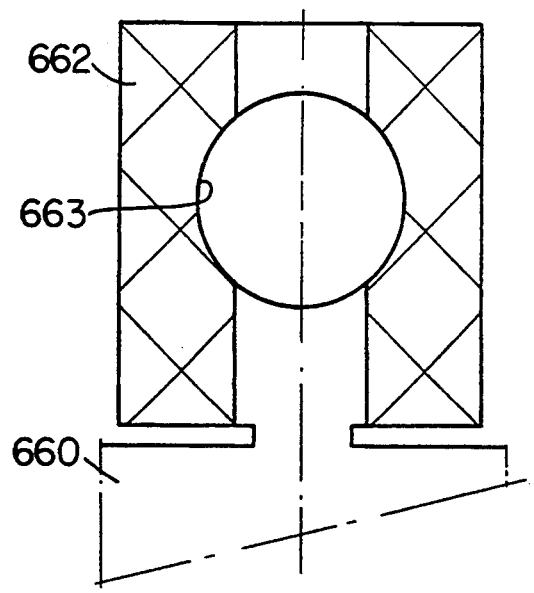
FIGS. 22a and 22b represent labels for decorating a card.
Figure 22B:
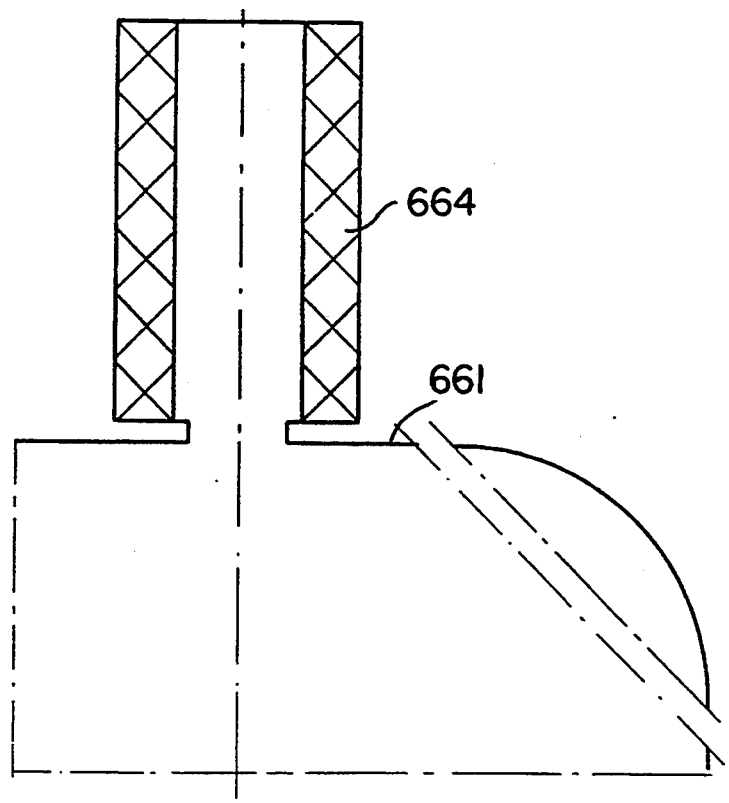

FIGS. 22a and 22b show the labels used in this procedure. FIG. 22a shows the upper label 660, which presents a tongue 662 having a generally rectangular shape, showing the opening 663 provided for positioning this tongue around the boss 633 of the shell 631. FIG. 22b shows the lower label 661 with its tongue 664.

The hatched zones denote the areas where will be applied the clamping force for keeping the labels in place in the mold during the molding process.

In a manner known per se in molding techniques, as shown diagrammatically in the drawings, there is provided between the two portions of the card a non-planar separation surface, in order to achieve a proper fastening of these portions to each other, and to optimize the filling ratio area vs. thickness of the mold for each of the injection operations, as a function of the position of the injection nozzles.

In the embodiments described above, the credit card is decorated on both sides while it is being molded using a standard two-part mold. The credit cards included an electronic module having flush electrical contacts on one face of the credit card. Decorations on both sides of the credit card are also provided in association with the electronic module. However, the techniques described above for forming such cards in molds, and especially for forming such cards completely decorated on one or both of the two opposite faces simultaneously with forming the card, can be adapted for other plastic cards obtained by molding whether or not they contain an electronic module. These cards can bear text or designs of all kinds, holograms, magnetic strips, printing readable by ultra-violet light, areas for writing the signature, and the like, of the card owner, and so on. In sum, all of the arrangements described above for forming cards are useable for many kinds of cards produced by molding whether or not they include an electronic module.

The methods described above permit a card to be decorated while it is being molded. This achieves great savings in cost and time because on one hand, rejection of cards because of poor printing is avoided and on the other hand, there is no need to take up the card again in order to decorate it after it is molded.

As already described above with reference to FIG. 17a-d, either labels or image transfer films can be used on either or both faces of the card. A label is affixed to the side of a card to be decorated and remains in its entirety on the side thus decorated. Known types of labels generally have a thickness between 40 microns and 100 microns.

Decorations can also be provided by using an image transfer film. An image transfer film is a film bearing an imprint that is to be positioned on the side of the card to be decorated. This film is removed after the molding process is completed and only the imprint remains on the finished product. The film is made of a material that is strong but one which can undergo deformation. Such films usually have a thickness of about 40 microns and the imprint itself may have a thickness of about ten microns.

Decoration of the two faces of a credit card is performed during the molding of the card in a classical two-part mold which requires only that the mold be modified at the injection nozzle, or nozzles, so as to be used in accordance with the present invention. As discussed above, for example, in relation to FIGS. 21a–c, two sided decoration is accomplished by arranging one of the image supports, that is, a label or a transfer film, around a boss through which an injection nozzle passes. The other image support is disposed opposite the outlet of the nozzle so that the injected plastic material flattens the other image support against the mold cavity. That is, the injected plastic is distributed between the two image supports which are pressed respectively against the opposite shells of the mold.

EP 340,100, filed by Schlumberger Industries, describes the preparation of a decorated card. The embodiment in FIG. 5 of this patent illustrates the molding of a card decorated on both sides. This method requires a particular mold having three parts 70, 74 and 78, of which the intermediate part 78 is fixed and contains the injection nozzles which provide plastic between the two image supports.

In FIG. 7 of EP 340,100, an image support is held in place against the bottom of the mold cavity by suction means. Such a procedure does not result in credit cards of good quality because the suction means leaves marks on the surface of the card where the suction is applied.

The decorating process of the present invention and the product produced are therefore important. The present method does not require substantial or expensive modifications of a standard mold and thus provides cards of very good quality at a low cost.

Figure 23A:
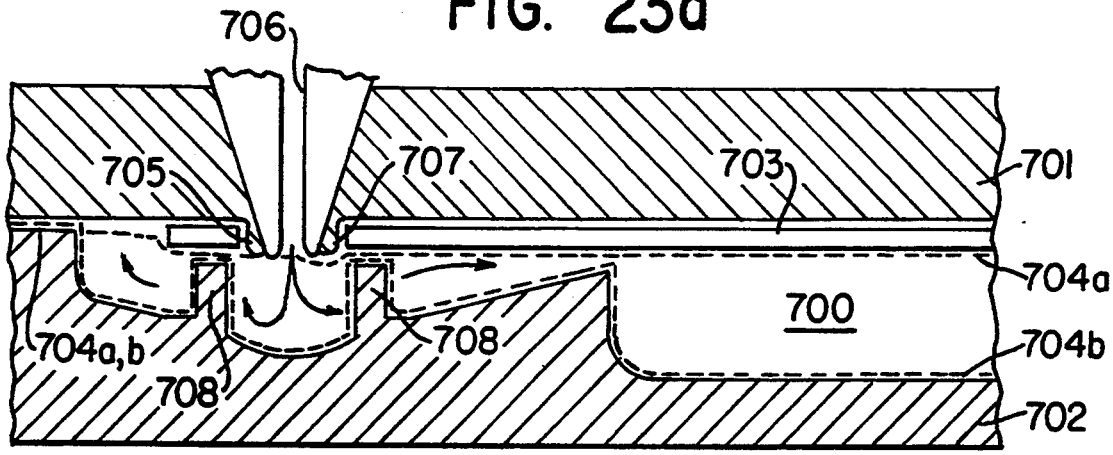
FIG. 23a is a partial sectional view of a mold embodiment showing details for plastic injection providing decoration on the two faces of a card.

FIG. 23a is an alternative embodiment of that shown in FIGS. 21a–c. In FIG. 23a, the plastic material is injected into a portion of the mold located external to the primary molding cavity 700 in which the card is formed. As a result, the initial product obtained by molding includes the card plus a prolongation or tongue bearing a mark of the injection point. The tongue is later severed from the card itself.

The mold in FIG. 23a permits only one card to be molded in each mold cycle and comprises two parts, a fixed part 701 and a moveable part 702. The mold half 701 or shell in this embodiment does not have a cavity. The surface is entirely flat. The cavity 700 wherein the plastic card is produced is entirely in the mold half or shell 702. This mold construction is illustrated to demonstrate a mold construction which has not been heretofore discussed in this application, that is, a mold half without a cavity.

Simply stated, the invention encompasses molds wherein each half includes a cavity and also molds where only one half has a cavity. It is well-known in the molding art to use molds having one cavity in each of the halves or a single cavity as in FIG. 23a.

In FIG. 23a, an injection nozzle 706 is positioned in the mold half 701 and passes through a boss 705 that extends from the primary internal surface of the mold half 701. That is, the boss 705 reaches below the surface of the mold half 701, as illustrated. An image support 703, represented without limitation in the form of a label, has an opening 707 through which the boss 705 projects. The label 703 is cut-out and surrounds the boss 705 at the nozzle 706. In place of the label 703, a transfer film could be used as the credit card requires. The label 703 will appear on the face of the finished credit card formed by the mold half 701. The other image support 704a,b (dashed lines), represented without limitation in the form of an image transfer film in FIG. 23a, is positioned adjacent the first image support 703 in the position represented by the reference numeral 704a. The image support at the position 704a is held by clasping it between the two mold halves 701, 702 as the mold is closed. When the image support 704a,b is a label, it is provided in one piece with a tongue in the form of a film as illustrated in FIGS. 22a,b.

The mold half 702 has posts 708 extending upward toward the mold half 701 and positioned so as to push against the label 703 around the boss 705 and to hold the label 703 flat against the mold half 701. The posts 708 press the film 704a against the label 703 and mold half 701 (although a clearance is shown in FIG. 23a at the ends of the posts 708 for the sake of clarity in illustration).

At least two such posts 708 are preferably used. The mold half 702 is contoured around these posts 708 so that the plastic injected in the nozzle 706 passes between the posts 708 to flow toward the mold cavity 700. When an injection of plastic is made, the image support at 704a deforms so as to conform to the contours of the mold half 702 and of the posts 708 so that it takes the position indicated at 704b.

The inner space 700 is completely filled with the molten plastic and presses the label 703 against the planar surface of the mold half 701 and the film at 704b against the mold half 702. The deflected film substantially covers the vertical edge between the flat sides of the credit card as illustrated in FIG. 23a.

The contours of the posts 708 and the thickness of the image support 704a,b are appropriately chosen so that the image support does not tear when the plastic is injected. FIG. 23a represents the mold on a very large scale; the total thickness of a credit card is in the order of 84/100 millimeters and the labels currently used have a thickness on the order of 70 to 80 microns. The thickness of a transfer film is in the order of 50 microns. The height of the posts 708 (FIG. 23a) is less than the total thickness of the card mold cavity 700 and low enough to permit the image support, whether film or label, to deform and apply itself around the posts 708.

Figure 23B:
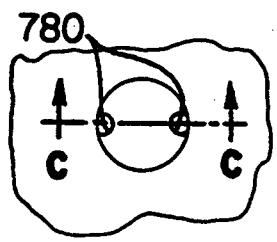
Figure 23C:
FIG. 23c is a sectional view along the line of c—c of FIG. 23b.

FIGS. 23b and 23c show the shape of the plastic on the tongue of the molded credit card (inverted from the position shown in FIG. 23a). There, the holes 780, produced by the posts 708, are visible in the plastic. The holes 780 do not pass entirely through to the flat surface of the card as the label 703 is positioned therebetween as indicated in FIG. 23a. Thus, the posts 708 leave imprints or indents 780 extending substantially up to the opposite side of the card.

Figure 24:
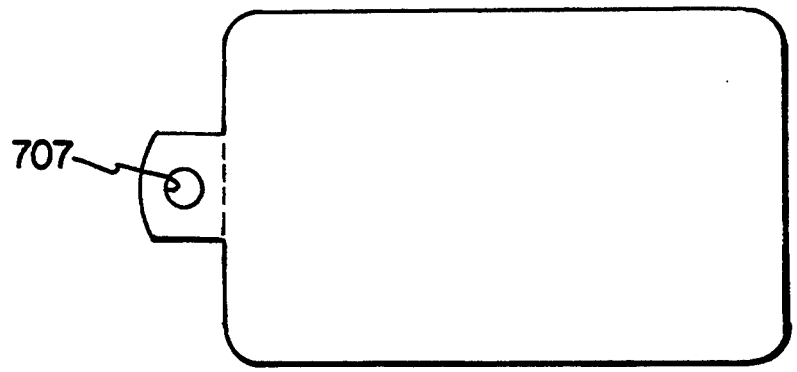
Figure 25A:
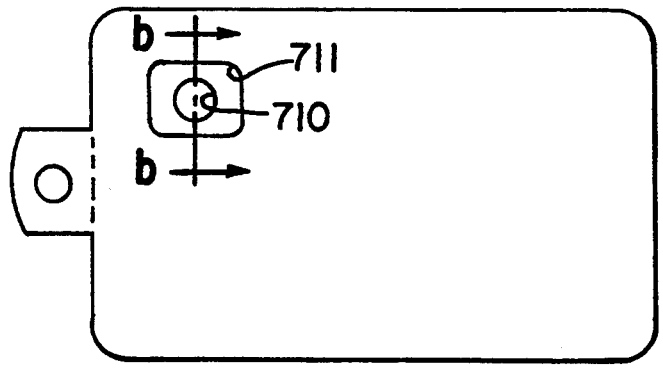
Figure 26:
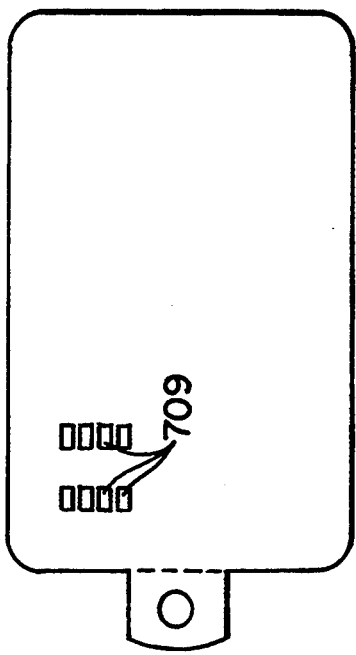

FIGS. 24, 25a and 26 show different types of cards that can be produced with a mold in accordance with FIG. 23a. In FIG. 24, the card does not include an electronic module. When produced as illustrated in FIG. 23a, the card is decorated on both sides, and can bear on one and/or the other of its sides, elements such as a magnetic strip, holograms, a place for a signature, etc.

The card in FIG. 26 includes an electronic module, the contacts 709 of which are illustrated flush with one of the sides of the credit card. The card is decorated on both sides (not shown). This card is obtained by a molding process with the localized application of pressure as described above, e.g. with reference to FIGS. 6, 13, 13a, 16 and 16a.

Figure 25B:
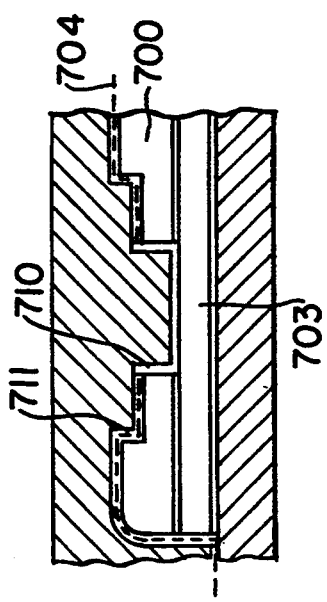

FIGS. 25a and 25b illustrate another advantage of the invention. The decorating process according to the present invention can advantageously be employed in manufacturing cards by known technologies. The illustrated card is decorated on the sides. As explained above EP 234,640 describes a method for manufacturing a card with an electronic module, according to which the module is inserted and fixed by gluing in a cavity in the plastic card. The card is decorated afterwards.

By arranging a mold as represented in FIG. 25b, it is possible to mold a card, which is decorated on both sides and also has a cavity for the installation of the electronic module. In the illustrated example, the cavity is stepped. The cavity has a portion 710, which is deep and round in section for receiving the resin block containing the electronic chip of a module. The cavity also has a portion 711, which is less deep and of quadrangular section, for positioning of the contacts.

As illustrated in FIG. 25b, the rectangular surface is decorated by the image transfer film as are the vertical edges of the produced card, at least in part.

In the prior art, that is up to the present time, a cavity has been obtained either during the molding[of the card or by machining the card, the decoration being produced only afterward in another step. It was then not possible to obtain a cavity, the bottom of which is less than 3/10 millimeters thick.

When the present invention is used, an image support (label or image transfer film), which is positioned in the mold, may serve as a bottom and the cavity can then extend to the image support. Thus, the bottom surface of the card at the cavity can be reduced to the thickness of the image support, that is, a few tens of microns.

Figure 27:
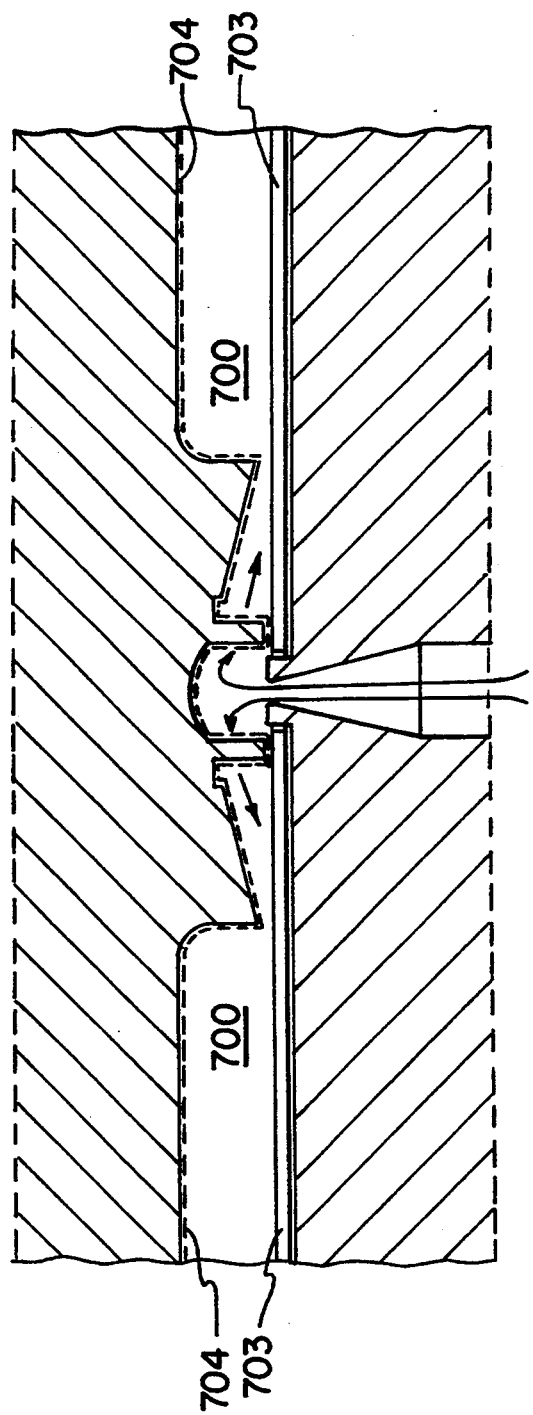
FIG. 27 is a view similar to FIG. 23a showing a mold having two cavities injected from a common nozzle.

FIG. 27 illustrates an embodiment of the invention similar to the mold embodiment (FIG. 23a) which has just been described. However, FIG. 27 illustrates a two cavity mold.

An injection nozzle is positioned between two card molding cavities 700. As in the embodiment of FIG. 23a, an image transfer film can be used along the upper surface of the card and a label at the lower surface of the card, or vice versa, or only labels or only films may be used in decorating both sides of the credit cards. In the illustrated embodiment, the film 704 is continuous through the tongue portions, and the injection nozzle is shown in an inverted position as compared to FIG. 23a. Operation of the mold of FIG. 27 to produce two credit cards with a single injection, is basically the same as the operation procedures for the mold of FIG. 23a.

Figure 28A:
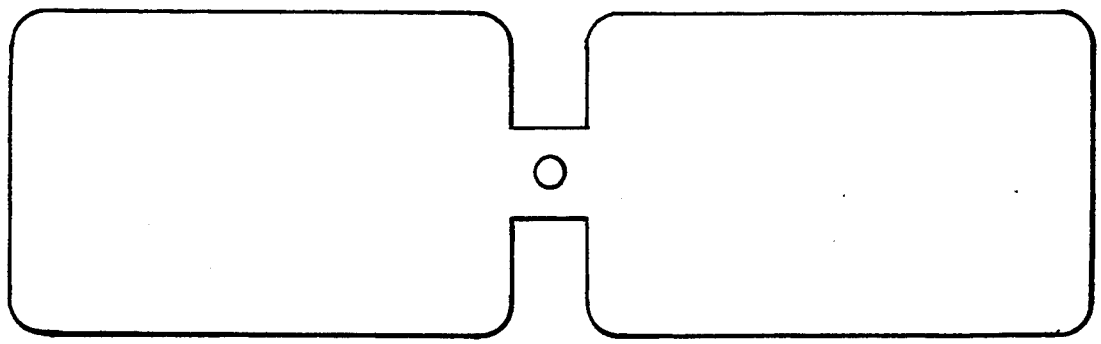
FIG. 28a is a two card product produced by a mold as in FIG. 27.
Figure 28B:
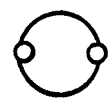
Figure 28C:
FIG. 28c is a sectional view along the line of c—c of FIG. 28b.

FIG. 28a illustrates the product obtained from the mold of FIG. 27. Two cards are formed, held together by a central strap bearing the post injection marks (FIGS. 28b,c) that are similar to those in FIGS. 23b-c. Credit cards such as those shown in FIGS. 24, 25a, 26, can of course be obtained with the mold device of FIG. 27 by adapting mold cavities (FIG. 23a) for two-card operation.

Figure 29A:
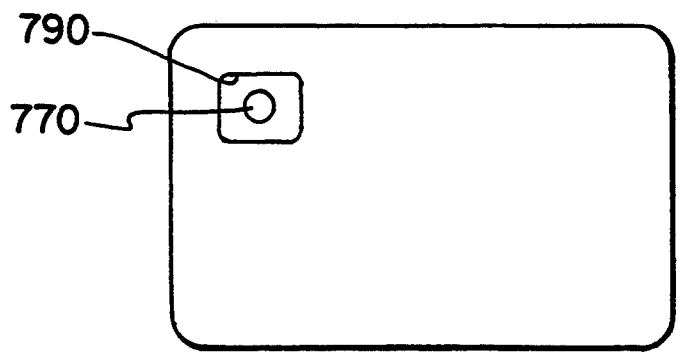
FIG. 29a is a credit card in accordance with the invention having a cavity for reception of an electronic module therein.
Figure 29B:
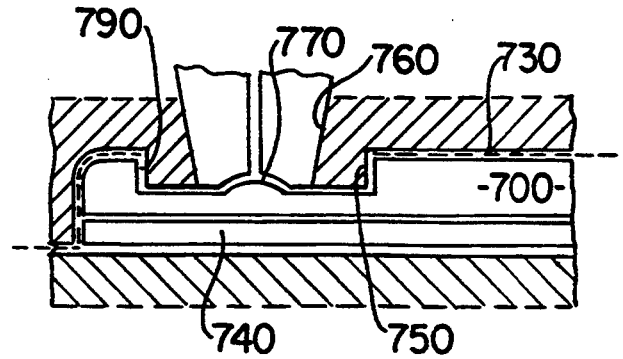
FIG. 29b shows a detail of a mold for producing a card as in FIG. 29a, said card including decorations on both faces and the edge.

FIG. 29b illustrates another embodiment of the invention for the manufacture of credit cards having a cavity for the insertion therein of an electronic module. In this embodiment, a boss 750, surrounds an injection nozzle 760. The boss 750 is necessary for positioning one of the image supports 730 and is also used to create a cavity 790, designed to contain an electronic module. The resultant product comprises, as illustrated in FIG. 29a, a cavity 790 at the bottom of which can be seen a mark 770 resulting from the injection of plastic. Plastic is injected directly into the mold cavity 700, which forms the card itself. The image transfer film 730 can extend (not shown) to partially cover the bottom surface of the cavity as illustrated in FIG. 29b. The use of either image film or a label is interchangeable, as discussed above.

In this embodiment, if the cavity 790 must be very deep, it will be machined after molding the card with a lesser cavity. Thus, it is possible to obtain a cavity having a bottom that is very thin because it is possible to machine the cavity all the way to the image support 740, which then serves as a cavity bottom as well as a stiffener. Also, the boss 750 can be stepped in contour to obtain a stepped cavity of the shape as described in conjunction with FIGS. 25a, 25b. The machining is required for a deep cavity because further extension of the boss 750 toward the opposite half shell will obstruct the flow of plastic from the nozzle 760.

Figure 30A:
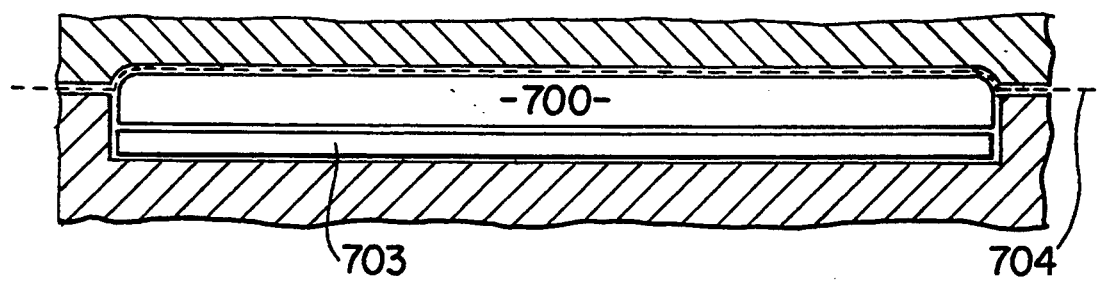
FIGS. 30a-c are cross-sectional views of molds showing different parting line locations between the mold shells, and the edge-covering effects of decoration on the two faces of the credit card.
Figure 30B:
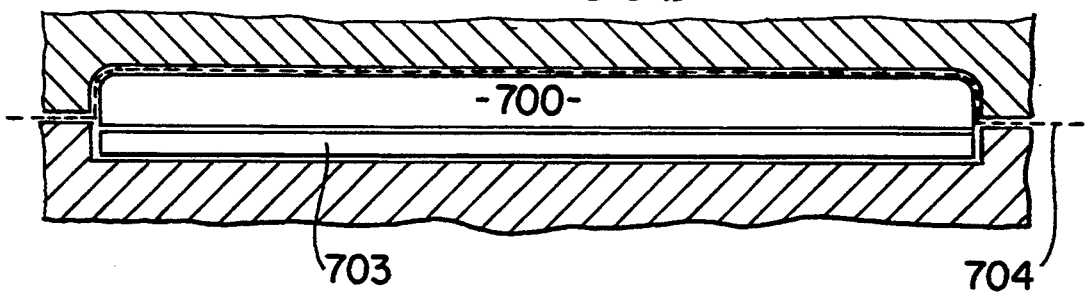
Figure 30C:
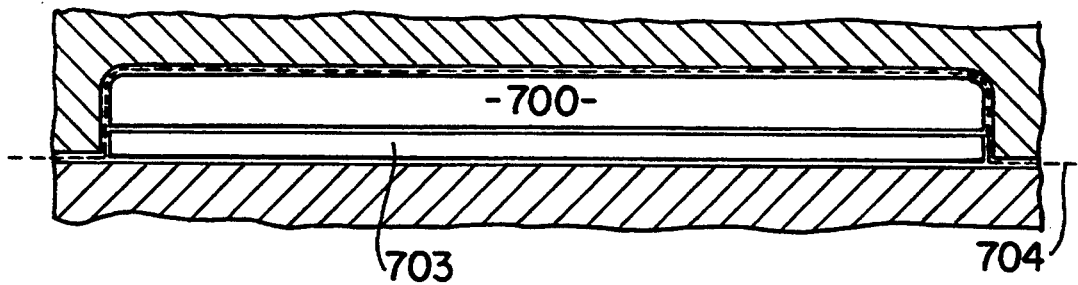

FIGS. 30a-c, illustrate different mold shapes. The parting line between the two mold halves or shells is at different levels along the vertical edges of the credit card to be produced. In FIG. 30a, the parting line is positioned so that the cavity is deep in the lower mold half and shallow in the upper mold half. As a result, the side edges of the produced credit card are mostly undecorated as the upper film extends only around the upper edge of the card periphery.

In FIG. 30b, the parting line is positioned such that the sides of the credit card are decorated except for the thickness of the lower label which is not decorated along its edges.

FIG. 30c, illustrates a mold where the entire cavity for producing the credit card is in one mold half, the lower mold half being completely flat. In this instance, the entire side edge, including the thickness of the label is decorated by the image transferred from the film.

It will thus be seen that the objects set forth above, among those made apparent from the preceding description, are efficiently attained and, since certain changes may be made in carrying out the above method without departing from the spirit and scope of the invention, it is intended that all matter contained in the description shall be interpreted as illustrative and not in a limiting sense.

What is claimed is:

1. A method for manufacture of a plastic card, comprising the steps of:
   providing a mold with two shells, said mold when closed having opposed faces defining a first cavity for producing a card by molding, peripheral edges of said mold faces defining the general outline of said card;
   placing at least one of a film and a label adjacent each one of said shells as an image support, said film and label each supporting a respective image,
   bringing said mold shells together a boss extended from one said shell face into said first cavity when said mold is closed, said boss having an end surface spaced from the other said shell face and having a passage of an injection nozzle therethrough, providing an opening in the image support in one said shell;

positioning said image support opening in alignment with said injection nozzle for flow of plastic through said opening;

positioning the other said image support against the end surface of said boss in front of an outlet of said injection nozzle;

injecting plastic through said outlet to fill said mold and form a card, said at least one of a film and label being forced against a respective shell face by said incoming plastic;

whereby injected plastic flows between said image supports, said image supports being forced apart in opposite directions and pressed by the injected plastic against the face of a respective shell;

cooling said molded card with said at least one of a film and a label adhering to respective sides thereof; and removing said card from said mold.

2. A method as in claim 1, Wherein one said shell is flat, said first cavity being formed entirely in the other said shell.

3. A method as in claim 1, wherein each said shell includes a recess, said recesses being opposed and forming said first cavity when said mold is closed.

4. A method as in claim 2, wherein said faces are separated by a distance equalling the thickness of said card to be molded.

5. A method as in claim 3, wherein said faces are separated by a distance equalling the thickness of said card to be molded.

6. A method as in claim 1, comprising the further step of:

providing an extension in said first cavity from said general outline of said card, a card being formed by said mold with an extended tongue;

positioning said boss and said nozzle for injection of plastic at said tongue portion of said first cavity.

7. A method as in claim 6, and further comprising the steps of:

providing posts extending from said opposed shell and when said mold is closed, extending toward said shell having said nozzle, said posts approaching close to the opposed shell, whereby said image holders are clamped between said posts and the face of said shell opposing said posts when said mold is closed, plastic from said nozzle flowing around said posts to fill said first cavity.

8. A method as in claim 6, and further comprising the step of:

shearing off said tongue after said molded card has cooled.

9. A method as in claim 6, comprising the further step of positioning a second mold with a second cavity for forming a card, said two molds being joined together by said tongue portion, said image supports extending away in two respective directions from said tongue, said nozzle being between said two molds, plastic injected through said nozzle flowing to form two credit cards simultaneously.

10. A method as in claim 1, wherein said boss extends to provide a recess in a side of said card, said recess being contoured to receive an electronic module therein.

11. A method as in claim 10, wherein said recess is stepped.

12. A method as in claim 1, wherein said image support adjacent said shell within said first cavity, is deformable, said deformed image support covering the side edges of said card, whereby the flat sides and the edge of said card may be decorated.

13. A method as in claim 3, wherein one of said film and label is deformable and supports an image, a portion of the edge of said card being covered by said image support, whereby a portion of said edge may be decorated, the proportion of said covered edge portion to the thickness of said molded credit card depending upon the relative depth of the respective recesses in said shells.

14. A method as in claim 1, and further comprising the step of providing a projection from the interface of one said shell, thereby, one outer side of said card is formed with a recess, the contour of said projection and the shape of said recess corresponding to the shape of an electronic module for insertion in said recess of the molded card.

15. A method as in claim 14, wherein said recess is stepped, a central stepped portion of said projection being circular in cross-section and extending closer to the opposite shell than the outermost stepped portion, said outer stepped portion being rectangular in cross-section.

16. A method as in claim 14, and further comprising the step of machining said recess to increase the depth thereof.

17. A method as in claim 16, wherein said recess is machined to a depth to reach at least one of a film and a label in the opposite side of said card from said recess.

18. A method as in claim 9, wherein said cavities are coplanar in a mirror-image arrangement.

19. A method as in claim 1, wherein said nozzle extends into said-image support opening.

* * * * *